United States Patent
Zbiciak et al.

(10) Patent No.: US 8,560,896 B2
(45) Date of Patent: Oct. 15, 2013

(54) PRIORITY BASED EXCEPTION MECHANISM FOR MULTI-LEVEL CACHE CONTROLLER

(75) Inventors: Joseph Raymond Michael Zbiciak, Arlington, TX (US); Raguram Damodaran, Plano, TX (US); Abhijeet Ashok Chachad, Plano, TX (US); Dheera Balasubramanian, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/245,164

(22) Filed: Sep. 26, 2011

(65) Prior Publication Data

US 2012/0198272 A1 Aug. 2, 2012

Related U.S. Application Data

(60) Provisional application No. 61/387,283, filed on Sep. 28, 2010.

(51) Int. Cl.
*G06F 11/00* (2006.01)

(52) U.S. Cl.
USPC .......................................................... 714/54

(58) Field of Classification Search
USPC .................................. 714/54, 6.11
See application file for complete search history.

(56) References Cited

U.S. PATENT DOCUMENTS

| | | | | |
|---|---|---|---|---|
| 4,648,029 | A * | 3/1987 | Cooper et al. | 710/113 |
| 5,964,871 | A * | 10/1999 | Hester et al. | 713/1 |
| 2002/0156962 | A1* | 10/2002 | Chopra et al. | 711/3 |
| 2006/0271825 | A1* | 11/2006 | Keaffaber et al. | 714/38 |
| 2011/0016295 | A1* | 1/2011 | Catherwood et al. | 712/244 |

OTHER PUBLICATIONS

Dictionary definition of page fault from: http://en.wikipedia.org/wiki/Page_fault; retrieved on Mar. 7, 2013.*
Dictionary definition of page from: http://en.wikipedia.org/wiki/Page_(computer_memory); retrieved on Mar. 7, 2013.*
Dictionary definition of page table from: http://en.wikipedia.org/wiki/Page_table; retrieved on Mar. 7, 2013.*
Dictionary definition of parity error from: http://en.wikipedia.org/wiki/Parity_error; retrieved on Mar. 7, 2013.*

* cited by examiner

*Primary Examiner* — Yair Leibovich
(74) *Attorney, Agent, or Firm* — Robert D. Marshall, Jr.; Wade James Brady, III; Frederick J. Telecky, Jr.

(57) ABSTRACT

This invention is an exception priority arbitration unit which prioritizes memory access permission fault and data exception signals according to a fixed hierarchy if received during a same cycle. A CPU memory access permission fault is prioritized above a DMA memory access permission fault of a direct memory access permission fault. Any memory access permission fault is prioritized above a data exception signal. A non-correctable data exception signal is prioritized above a correctable data exception signal.

5 Claims, 5 Drawing Sheets

US 8,560,896 B2

PRIORITY BASED EXCEPTION MECHANISM FOR MULTI-LEVEL CACHE CONTROLLER

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is cache for digital data processors.

BACKGROUND OF THE INVENTION

Data processor memory systems can service requests from its central processing unit (CPU) or from external masters. Requests from external masters will arrive on a slave DMA port and termed as slave DMAs.

At any given time there could be multiple requests in flight inside memory system from various masters. These requests needs to be serviced based on requestor permissions and access permissions of the accessed memory location. If an access attempt violates access permission, the corresponding requestor needs to be notified and an exception taken. Exceptions also need to be taken on various types of error detection and correction (EDC) errors in data. These exceptions typically will be routed to interrupt controller to enable corrective action based on the type of exception.

These criticality of these exceptions varies based on the requestor of the access attempt that caused the exception. Existing solutions do not have priority based exception handling mechanism based on the identity of the requestor. This could result in the exception controller taking non-trivial corrective actions when the exception is from a lower-priority requestor like external master. Other solutions implement priority among different requests from a single master.

SUMMARY OF THE INVENTION

This invention is an exception priority arbitration unit which prioritizes memory access permission fault and data exception signals according to a fixed hierarchy if received during a same cycle. A CPU memory access permission fault is prioritized above a DMA memory access permission fault of a direct memory access unit. Any memory access permission fault is prioritized above a data exception signal. A non-correctable data exception signal is prioritized above a correctable data exception signal.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
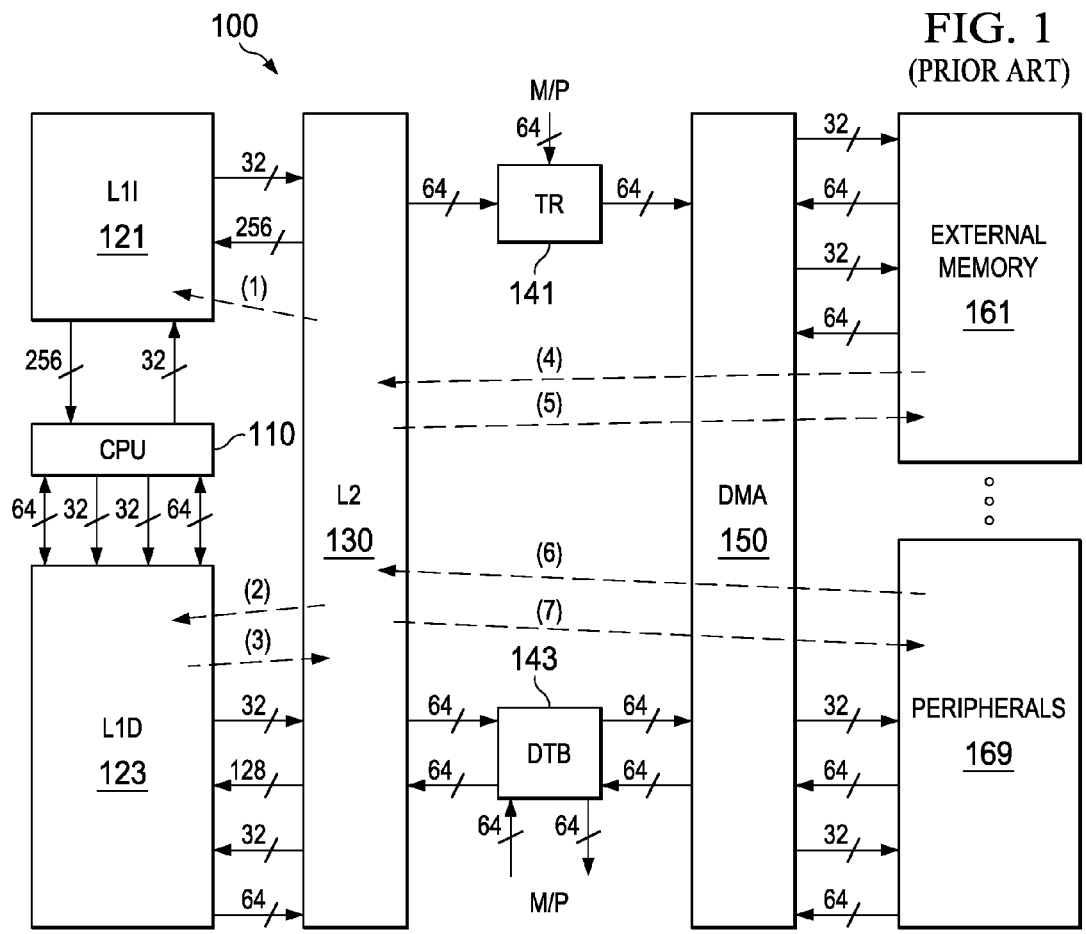
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
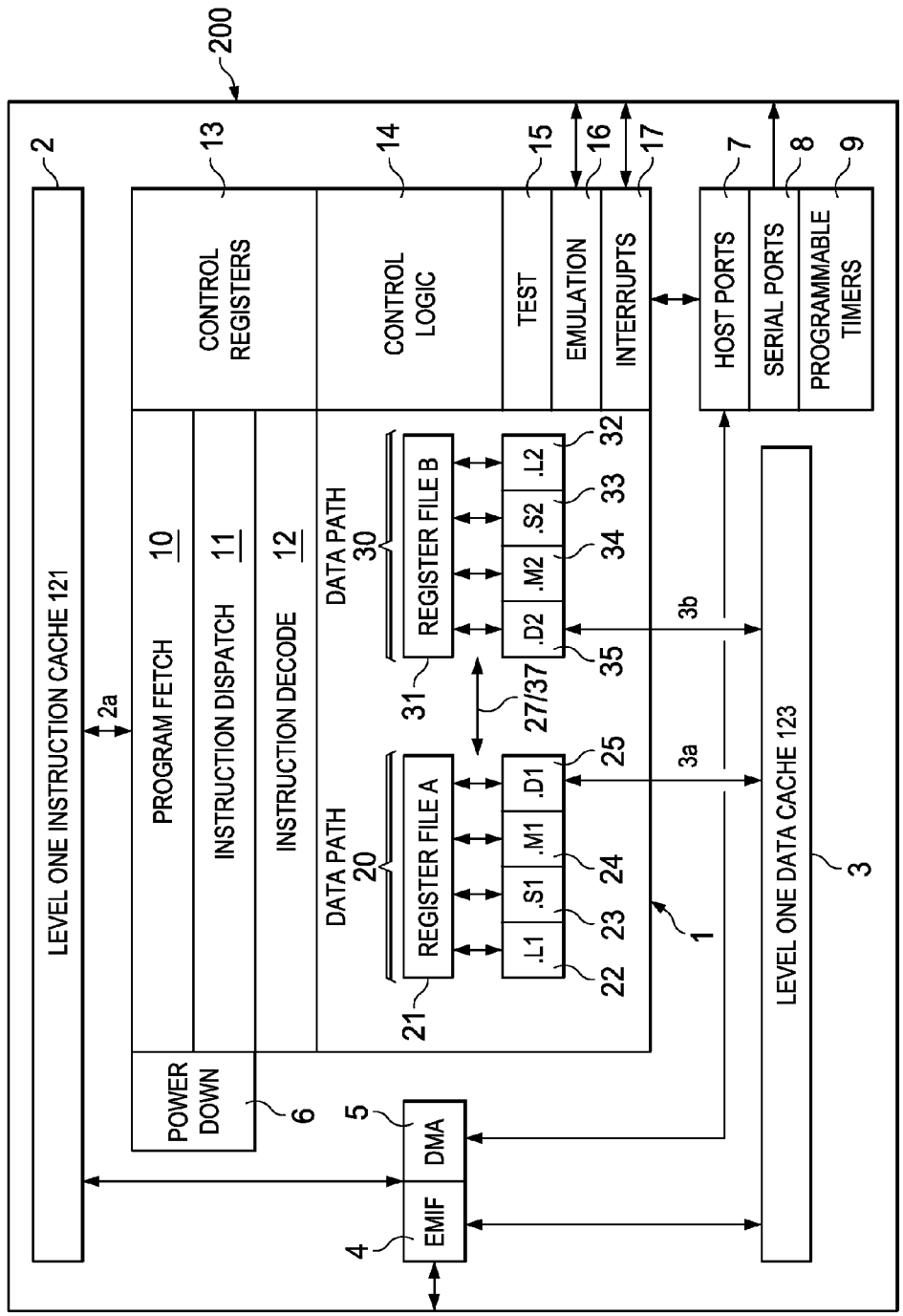
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3$a$ and 3$b$. Each internal port 3$a$ and 3$b$ preferably has 32 bits of data and a 32-bit byte address reach. Level one instruction cache 121 may be internally accessed by central processing unit 1 via a single port 2$a$. Port 2$a$ of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
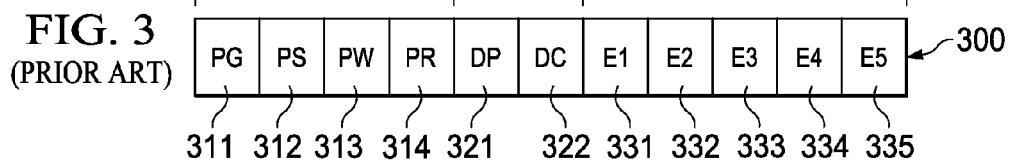
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figures 4, 5:
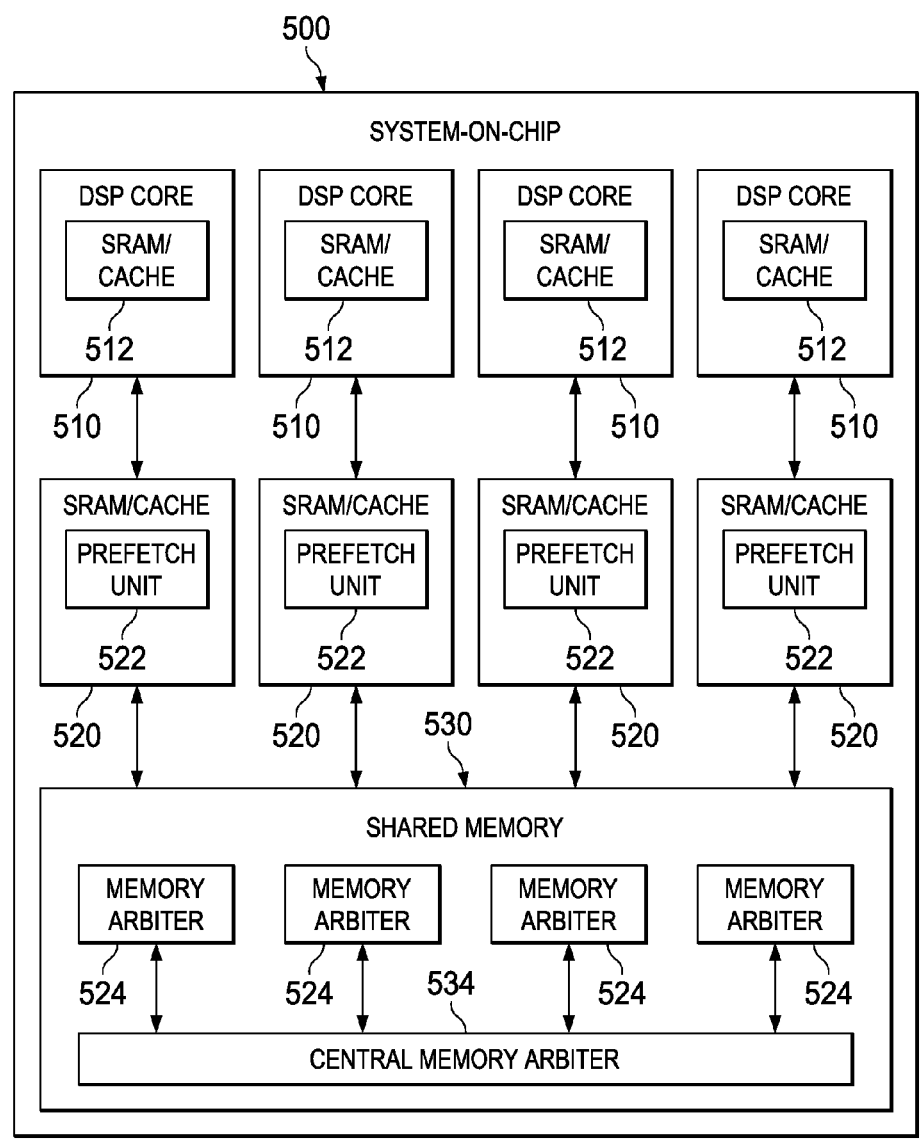
FIG. 4 illustrates the instruction syntax of the very long instruction word digital signal processor core illustrated in FIG. 2 (prior art)
FIG. 5 illustrates a computing system including a local memory arbiter according to an embodiment of the invention.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

|  | Conditional Register | | | |
|---|---|---|---|---|
|  | creg | | | z |
|  | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch 522. Each prefetch 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 510. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP core 510. Central memory arbiter 534 controls memory accesses for shared memory 530 that are generated by differing DSP cores 510 that do not share a common local memory arbiter 524.

Figure 6:
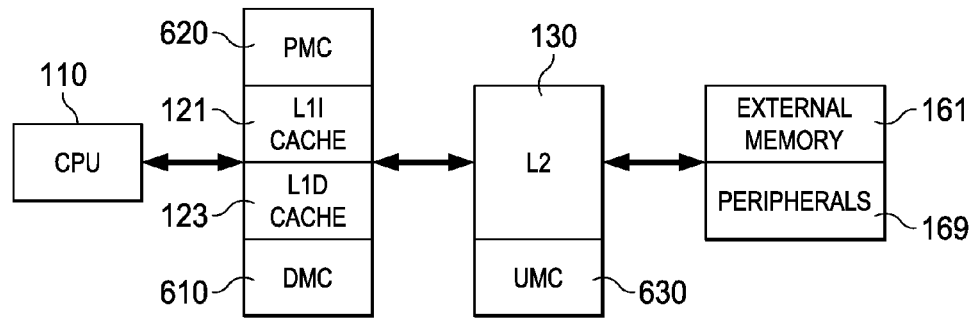
FIG. 6 is a further view of the digital signal processor system of this invention showing various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 are controlled by data memory controller (DMC) 610. Data transfers into and out of L1I cache 121 are controlled by program memory controller (PMC) 620. Data transfers into and out of L2 130 including both cache and directly addressable memory (SRAM) are controlled by unified memory controller (UMC) 630. This application is primarily concerned with level 2 cache and UMC 630.

Figure 7:
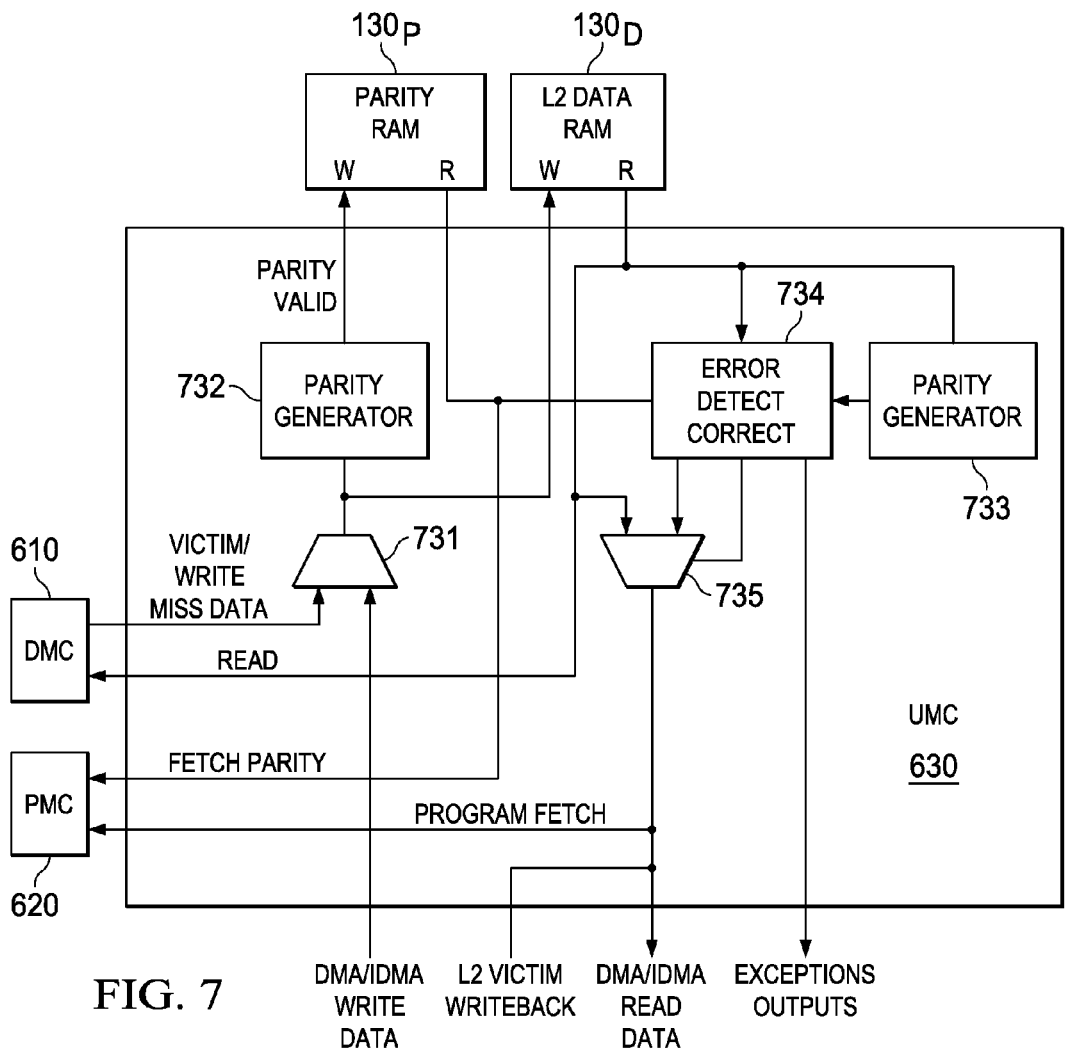
FIG. 7 illustrates the soft error protection system of this invention.

FIG. 7 illustrates the soft error protection system of this invention. Note FIG. 7 illustrates only data flow and does not show distribution of addresses for clarity. FIG. 7 illustrates DMC 610, PMC 620, UMC 630, parity RAM $130_P$ and L2 data RAM $130_D$. DMC 610 supplies victim write data to one input of multiplexer 731. DMA and IDMA write data for L2 data RAM $130_D$ supplies the other input of multiplexer 731. Multiplexer 731 selects one of its inputs for output.

Writes to L2 cache 130 occurs as follows. The output of multiplexer 731 supplies the input of parity generator 732 and the write input of L2 data RAM $130_D$. By this data routing parity generator 732 generates parity bits corresponding to the data being stored in L2 data RAM $130_D$. The parity and validity bits of parity generator 732 supplies the write input of parity RAM $130_P$. The same address is supplied to both parity RAM $130_P$ and L2 data RAM $130_D$ (not shown in FIG. 7). Thus the data and parity are stored in corresponding locations in parity RAM $130_P$ and L2 data RAM $130_D$.

Reads from L2 cache 130 occurs as follows. Data is recalled from L2 data RAM $130_D$ simultaneously with recall of the corresponding parity bits from parity RAM $130_P$. The same address is supplied to both parity RAM $130_P$ and L2 data RAM $130_D$ (not shown in FIG. 7). The data is supplied to four places. The data recalled from L2 data RAM $130_D$ is supplied directly to DMC 610. L1D cache 123 does not store parity bits and thus these are not supplied to DMC 610. The data recalled from L2 data RAM $130_D$ is supplied to one input of multiplexer 735. The data recalled from L2 data RAM $130_D$ is also supplied parity generator 733 and error detect/correct unit 734. Parity generator 733 operates the same as parity generator 732 forming parity bits corresponding to the data recalled from L2 data RAM $130_D$. Parity generator 733 supplies these parity bits to error detect/correct unit 734. Error detect/correct unit 734 also receives parity bits recalled from parity RAM $130_P$. Error detect/correct unit 734 compares the newly formed parity bits with the recalled parity bits. If these are the same, then error detect/correct unit 734 controls multiplexer 735 to select the data just recalled from L2 data RAM $130_D$. The output of multiplexer 735 is supplied to PMC 620 together with the parity bits recalled from parity RAM $130_P$. This supplies a program fetch generating a cache miss in L1I cache 121 if PMC 620 was the requestor. L1I cache 121 stores the combined parity bits and data for internal error correction. This is done because instructions stored in L1I cache 121 have a long life and are more subject to soft errors. The output of multiplexer 735 is supplied to the DMA/IDMA read data output without the parity bits. This data channel does not use further error detection/correction and does not use the parity bits. The output of multiplexer 735 lastly supplies a L2 victim output to external memory without the parity bits. This data channel does not use further error detection/correction and does not use the parity bits.

If error detect/correct unit 734 determines the just generated parity bits do not match the recalled parity bits, error detect/correct unit 734 attempts to correct the data. If error detect/correct unit 734 successfully corrects the data, it supplies the corrected data to the second input of multiplexer 735. Error detect/correct unit 734 controls multiplexer 735 to output this correct data to PMC 620 and the DMA/IDMA read data output. When error detect/correct unit 734 cannot correct the data, it signals the error at exceptions output. Generally the read also aborts.

Figure 8:
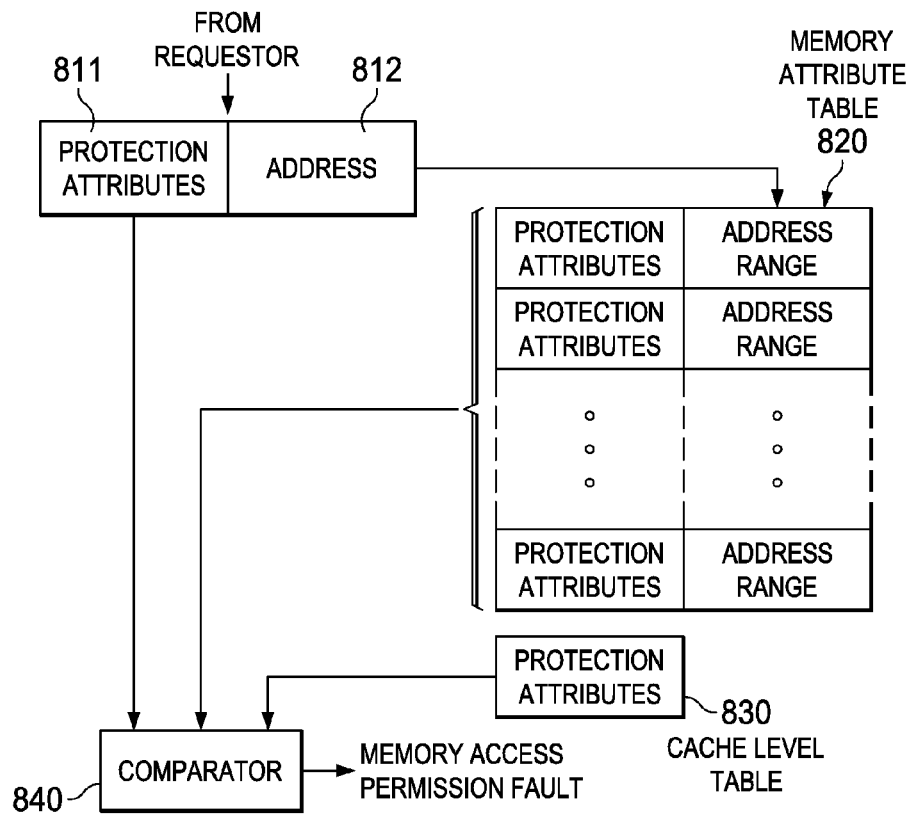
FIG. 8 illustrates the generation of memory protection faults.

FIG. 8 illustrates the generation of memory protection faults. The access requestor possess a set of memory protection attributes and generates an access address. As shown in FIG. 8 the protection attributes are stored in a register section 811 and the address is stored in register section 812. The address in register section 812 is supplied to memory attribute table 820. Memory attribute table 820 stores memory protection attributes for corresponding address ranges. The address in register section 812 is compared with the address ranges in memory attribute table 820. Memory attribute table 820 outputs the protection attributes of the memory address range including the accessed range stored in register section 812. Cache protection table 830 includes protection attributes corresponding to the cache level in the memory hierarchy.

Comparator 840 receives three inputs. A first input is the requestor generated protection attributes stored in register section 811. A second input is the protection attributes from memory attribute table 820 corresponding to the address range encompassing the requested address. A third input is the protection attributes from the cache protection table 830 corresponding to the cache level. Comparator 840 generates a memory access permission fault if the requestor protection attributes are insufficient to access the corresponding address range and cache level.

The multi-processor system of this invention implements a priority among similar types of exceptions from various masters. Memory system generates different types of exceptions based on various events that happen while processing requests from different masters. If an access, fails access permissions, it triggers an exception and logs the information related to request in internal configuration registers so that the master can read it later for debug purposes. Similarly, it will generate an exception if the parity does not correspond to the data. Memory systems can generate unique exception in events of 1-bit EDC error and 2-bit EDC error. In the present embodiment a one bit EDC error is correctable while 2-bit errors are non-correctable. The memory system implements priority based exceptions as multiple requests from different masters can cause these error events simultaneously. Here is the summary of the priority order memory system follows:

A CPU triggered exception supersedes any external master exception. In case of CPU and DMA requests violating access permission in same cycle, the memory system prioritizes CPU request. This means it will generate exception related to CPU and logs the information related to the request from CPU in its internal configuration register. If a request from CPU 110 violates access permission, the memory system will generate a new exception and log the information related to this requests by overwriting any prior DMA error information that it has logged.

Non-correctable EDC errors always supersedes correctable errors. The memory system has error detection and correction (EDC) mechanism which can detect up to 2-bit errors known as detectable errors. The EDC can correct 1-bit errors known as correctable errors. Since multiple requests can be processed simultaneously, correctable and non-correctable errors can happen on same cycle. Memory system always prioritizes non-correctable errors over correctable errors and logs information related to non-correctable error in its internal configuration registers for further debug.

Figure 9:
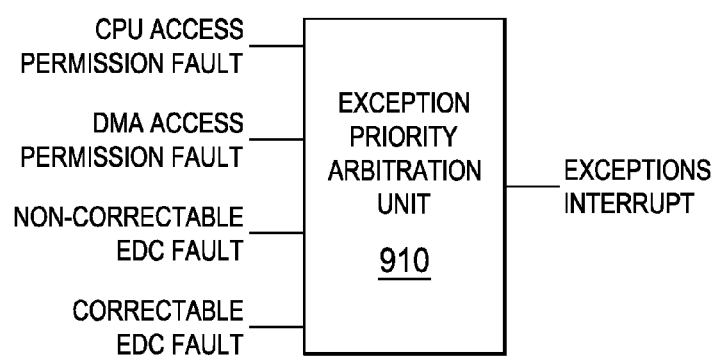
FIG. 9 illustrates an exception priority arbitration unit according to this invention.

FIG. 9 illustrates an exception priority arbitration unit 910 according to this invention. Exception priority arbitration unit 710 receives four types of faults: CPU access permission faults from comparator 840; DMA access permission faults from comparator 840; non-correctable EDC faults from error detect/correct unit 734; and correctable EDC faults from error detect/correct unit 734. Exception priority arbitration unit 910 prioritizes these faults as shown in Table 2.

TABLE 2

| Fault Type | Priority Rank |
|---|---|
| CPU access permission faults | 1 |
| DMA access permission faults | 2 |
| Non-correctable EDC faults | 3 |
| Correctable EDC faults | 4 |

Upon receipt of plural interrupts exception priority arbitration unit 910 selects one exception based upon the relative priority ranks of the received exceptions. This selected exception then loads its parameters into the configuration register for use in recovery.

What is claimed is:

1. A data processing system comprising:
 a central processing unit for executing instructions manipulating data;
 a direct memory access unit connected to said central processing unit, said direct memory access unit operating under control of said central processing unit to control data transfers including transferring data into a second level directly addressable memory;
 a memory attribute table storing required memory protections attributes corresponding to address ranges;
 a cache protection table storing required memory protections attributes corresponding to cache level;
 a comparator connected to said central processing unit, said direct memory access unit, said memory attribute table and said cache protection table, said comparator comparing memory protection attributes of a memory access with memory protection attributes of a corresponding address range recalled from said memory attribute table and with memory protection attributes of a corresponding cache level recalled from said cache protection table, and generating a memory access permission fault if said memory protection attributes of said memory access are insufficient to access a corresponding address range recalled from said memory attribute table and cache level;
 a memory error detect/correct unit generating an data exception signal upon detection of an error in data read from a memory; and
 an exception priority arbitration unit connected to said comparator and said memory error detect/correct unit, said exception priority arbitration unit outputting one received memory access permission fault or data exception signal according to a fixed hierarchy if received during a same cycle.

2. The data processing system of claim 1, wherein:
 said fixed hierarchy prioritizes a memory access permission fault of a central processing unit access above a memory access permission fault of a direct memory access permission fault.

3. The data processing system of claim 1, wherein:
 said fixed hierarchy prioritizes any memory access permission fault above a data exception signal.

4. The data processing system of claim 1, wherein:
 said memory error detect/correct unit is operable to generate a non-correctable data exception signal and a correctable data exception signal; and
 said fixed hierarchy prioritizes a non-correctable data exception signal above a correctable data exception signal.

5. The data processing system of claim 1, wherein:
 said memory error detect/correct unit is operable to generate a non-correctable data exception signal and a correctable data exception signal; and
 said fixed hierarchy prioritizes input in the following order from highest priority to lowest priority
  a memory access permission fault of a central processing unit access,
  a memory access permission fault of a direct memory access permission fault,
  a non-correctable data exception signal, and
  a correctable data exception signal.

* * * * *